(12) United States Patent
Seery et al.

(10) Patent No.: US 11,705,855 B2
(45) Date of Patent: Jul. 18, 2023

(54) INTERLOCKING BIPV ROOF TILE WITH BACKER

(71) Applicant: Tesla, Inc., Austin, TX (US)

(72) Inventors: Martin Seery, San Rafael, CA (US); Charles Bernardo Almy, Berkeley, CA (US); Kathryn Austin Pesce, San Francisco, CA (US)

(73) Assignee: Tesla, Inc., Austin, TX (US)

( * ) Notice: Subject to any disclaimer, the term of this patent is extended or adjusted under 35 U.S.C. 154(b) by 84 days.

(21) Appl. No.: 17/314,495

(22) Filed: May 7, 2021

(65) Prior Publication Data

US 2021/0265941 A1 Aug. 26, 2021

Related U.S. Application Data

(63) Continuation of application No. 15/910,310, filed on Mar. 2, 2018, now Pat. No. 11,012,025.

(51) Int. Cl.
*H02S 20/25* (2014.01)
*E04D 1/30* (2006.01)
*H02S 30/10* (2014.01)
*H01L 31/049* (2014.01)
*H02S 40/36* (2014.01)
(Continued)

(52) U.S. Cl.
CPC ............. *H02S 20/25* (2014.12); *E04D 1/265* (2013.01); *E04D 1/30* (2013.01); *E04D 1/34* (2013.01); *H01L 31/049* (2014.12); *H01L 31/0504* (2013.01); *H02S 30/10* (2014.12); *H02S 40/36* (2014.12); *E04D 2001/308* (2013.01); *E04D 2001/3414* (2013.01); *E04D 2001/3447* (2013.01); *E04D 2001/3494* (2013.01)

(58) Field of Classification Search
CPC .......... H02S 20/25; H02S 30/10; H02S 40/36; H02S 30/00; E04D 1/265; E04D 1/30; E04D 1/34; E04D 2001/308; E04D 2001/3414; E04D 2001/3447; E04D 2001/3494; H01L 31/049; H01L 31/0504; Y02A 30/60; Y02B 10/10; Y02E 10/50
See application file for complete search history.

(56) References Cited

U.S. PATENT DOCUMENTS 4,860,509 A 8/1989 Laaly et al.
5,575,861 A 11/1996 Younan et al.
(Continued)

OTHER PUBLICATIONS

Final Office Action received for U.S. Appl. No. 15/910,310, dated Sep. 17, 2020, 11 pages.
(Continued)

*Primary Examiner* — Phi D A
(74) *Attorney, Agent, or Firm* — DLA Piper LLP (US)

(57) ABSTRACT

Building integrated photovoltaic (BIPV) systems provide for solar panel arrays that can be aesthetically pleasing to an observer. BIPV systems can be incorporated as part of roof surfaces as built into the structure of the roof, particularly as photovoltaic modules having the appearance of a plurality of roofing tiles that each have photovoltaic cells. Each photovoltaic module may include a metal backer, photovoltaic cells, and light transmissive top sheets adhered to both the metal backer and the photovoltaic cells. BIPV systems can also include non-photovoltaic modules that appear similar to photovoltaic modules, but do not collect solar energy.

18 Claims, 13 Drawing Sheets

(51) Int. Cl.
*H01L 31/05* (2014.01)
*E04D 1/34* (2006.01)
*E04D 1/26* (2006.01)

(56) References Cited

U.S. PATENT DOCUMENTS

| | | | | |
|---|---|---|---|---|
| 5,990,414 | A * | 11/1999 | Posnansky | H02S 20/25 |
| | | | | 52/173.3 |
| 6,360,497 | B1 * | 3/2002 | Nakazima | H02S 40/34 |
| | | | | 52/173.3 |
| 6,914,182 | B2 | 7/2005 | Takeda et al. | |
| 8,003,882 | B2 | 8/2011 | Pisklak et al. | |
| 8,276,329 | B2 * | 10/2012 | Lenox | H01L 31/04 |
| | | | | 52/173.3 |
| 8,505,248 | B1 * | 8/2013 | Leong | F24S 25/16 |
| | | | | 52/173.3 |
| 8,713,860 | B2 * | 5/2014 | Railkar | H02S 40/36 |
| | | | | 52/173.3 |
| 9,048,358 | B2 | 6/2015 | Reese et al. | |
| 10,036,577 | B2 * | 7/2018 | Mascolo | F24S 25/16 |
| 2008/0000174 | A1 * | 1/2008 | Flaherty | H01L 31/042 |
| | | | | 52/173.3 |
| 2009/0000221 | A1 | 1/2009 | Jacobs et al. | |
| 2011/0162301 | A1 | 7/2011 | Ueda et al. | |
| 2012/0000502 | A1 | 1/2012 | Wiedeman et al. | |
| 2014/0299179 | A1 * | 10/2014 | West | H02S 20/24 |
| | | | | 136/251 |
| 2014/0318051 | A1 * | 10/2014 | Carlson | E06B 3/4618 |
| | | | | 52/745.16 |
| 2016/0164453 | A1 | 6/2016 | Cropper et al. | |
| 2017/0163206 | A1 * | 6/2017 | Rodrigues | H02S 40/36 |
| 2017/0194895 | A1 | 7/2017 | Fernandes et al. | |
| 2017/0237389 | A1 * | 8/2017 | Hudson | E04D 3/363 |
| | | | | 136/251 |
| 2017/0237390 | A1 * | 8/2017 | Hudson | E04D 3/361 |
| | | | | 136/251 |
| 2018/0062562 | A1 | 3/2018 | Azoulay | |
| 2018/0115275 | A1 | 4/2018 | Flanigan et al. | |
| 2018/0167021 | A1 * | 6/2018 | O'Rourke | H02S 20/23 |
| 2018/0294765 | A1 | 10/2018 | Friedrich et al. | |
| 2018/0358494 | A1 | 12/2018 | Pilat et al. | |
| 2018/0375463 | A1 | 12/2018 | Gorny et al. | |
| 2019/0036484 | A1 * | 1/2019 | Patton | H02S 40/345 |
| 2019/0089293 | A1 | 3/2019 | Almy | |
| 2019/0273463 | A1 | 9/2019 | Seery et al. | |

OTHER PUBLICATIONS

First Action Interview—Office Action received for U.S. Appl. No. 15/910,310, dated Feb. 5, 2020, 4 pages.
Notice of Allowance received for U.S. Appl. No. 15/910,310, dated Jan. 27, 2021, 7 pages.
Pre-Interview First Office Action received for U.S. Appl. No. 15/910,310, dated Sep. 30, 2019, 4 pages.

* cited by examiner

FIG. 1A
(Prior Art)
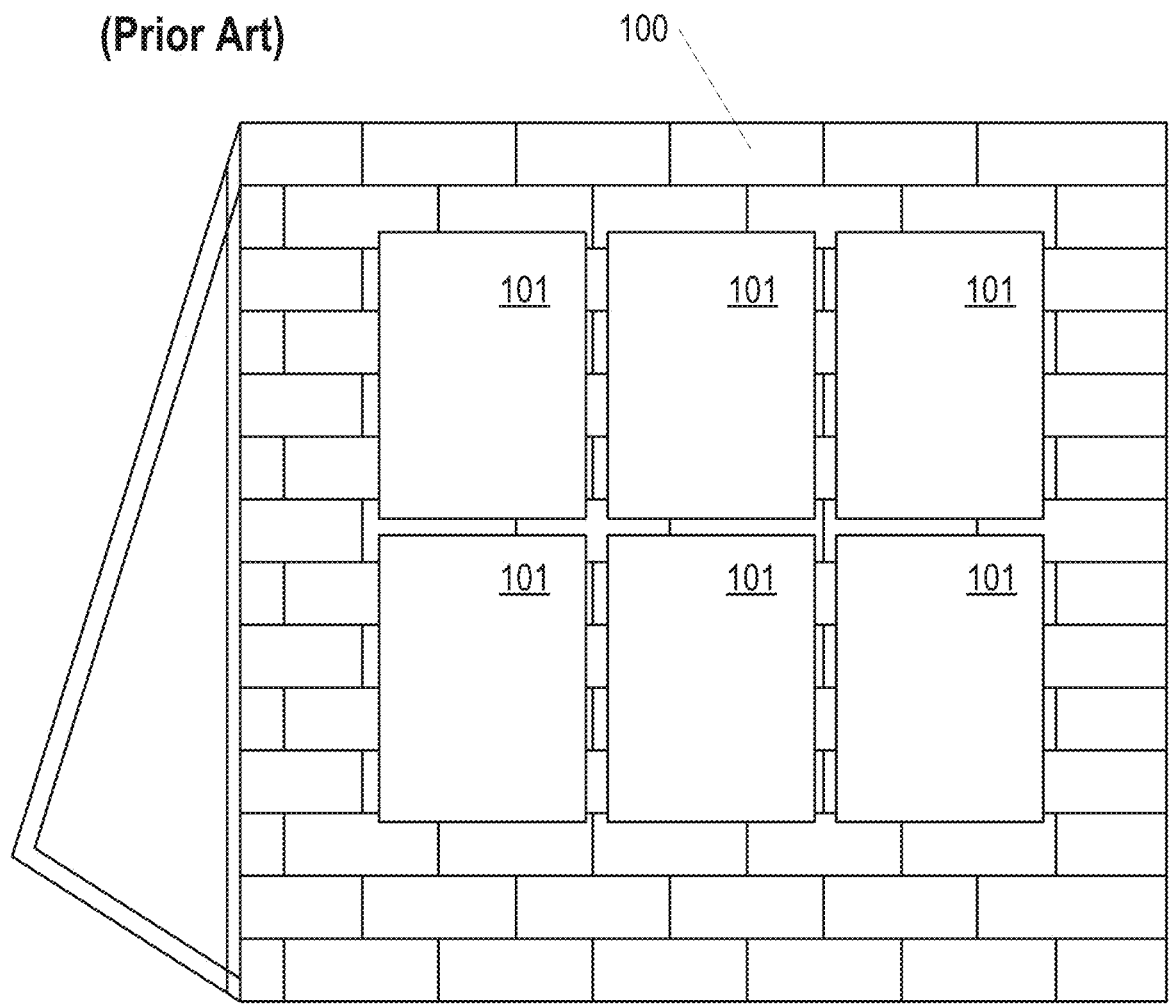
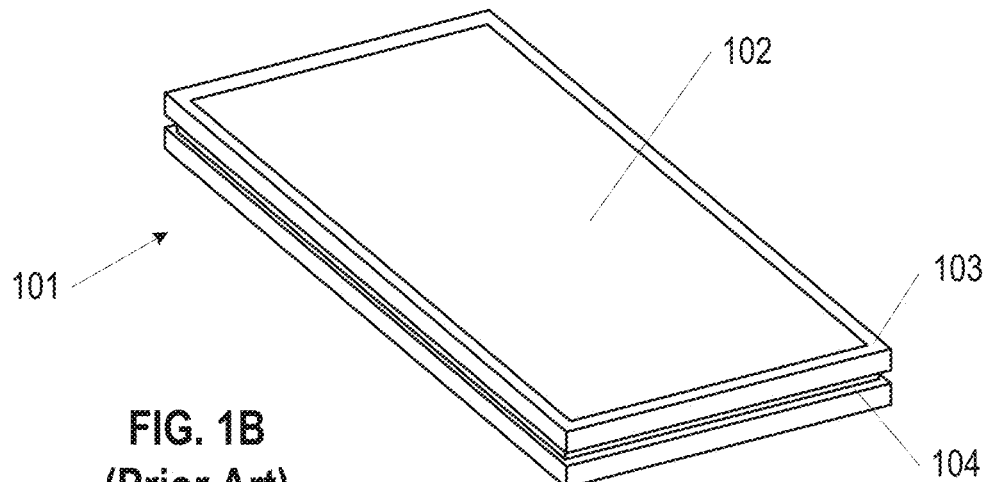
FIG. 1B
(Prior Art)

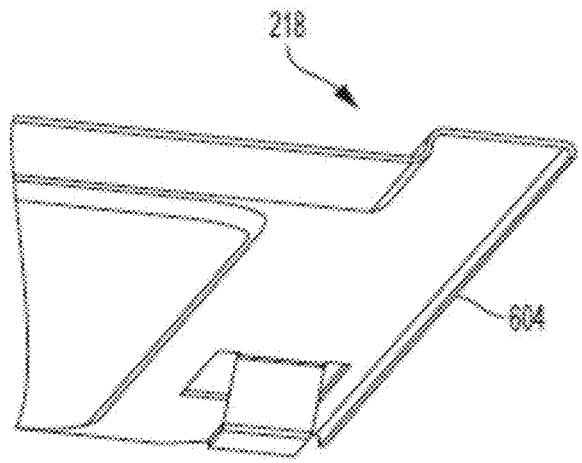 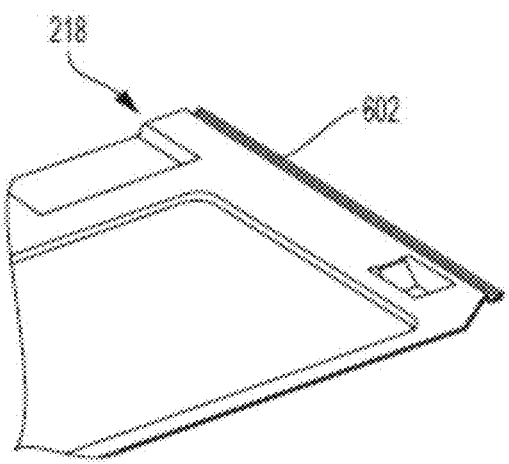
Fig. 6A  Fig. 6B
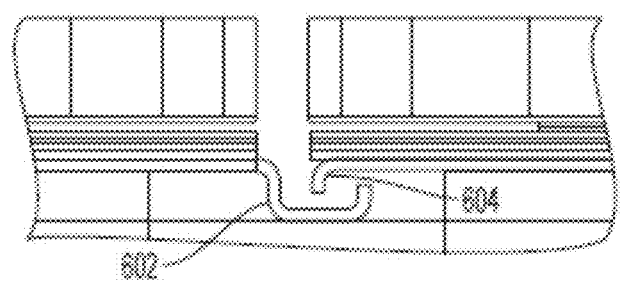
Fig. 6C

INTERLOCKING BIPV ROOF TILE WITH BACKER

CROSS-REFERENCE TO RELATED APPLICATIONS

This application is a continuation of U.S. patent application Ser. No. 15/910,310, titled "INTERLOCKING BIPV ROOF TILE WITH BACKER," filed Mar. 2, 2018, the content of which is hereby incorporated by reference in its entirety for all purposes

TECHNICAL FIELD

This generally relates to photovoltaic arrays.

BACKGROUND

Solar is becoming increasingly popular in the United States and abroad, but penetration remains relatively low versus the number of homes that could benefit from solar. The price per kilowatt for solar is now competitive with or below that of utility power in most areas, however, solar largely remains a niche product for those who value saving money, reducing $CO_2$ emissions, or both.

One factor that may limit the adoption of solar technology is aesthetics. Most residential solar systems are installed as rectangular framed photovoltaic (PV) modules positioned above an existing tile or composite shingle roof. The solar array often only covers a portion of the roof and therefore stands out both in height and material as separate and distinct from the underlying existing roof. This structure is visible even from the street level and over large distances.

Another obstacle to solar adoption in existing homes is the dissonance between the age of the existing roof and the lifespan of the solar system, particularly where the existing roof is made from composite shingles. The expected life of a solar system can be about 25 years, and the expected life of a composite shingle roof is about 50 years, depending on the local climate and specific tile materials. At the time a customer is considering going solar, their existing roof may have less remaining lifespan than the lifespan of a solar system. So when deciding to go solar, the customer may be presented with the dilemma of getting a new underlying roof in addition to the solar system, which therefore dramatically increases the cost of going solar.

Accordingly, there is a need to resolve the dissonance between the expected life of the solar system and the remaining life of the roof, that also blends in aesthetically with the complete roof surface, and that does not require the prospective customer to pay for a new roof and a new solar system over that roof.

BRIEF SUMMARY

Various embodiments provide a new and improved approach to installing solar as a roofing surface. Some aspects are installed over existing roof structures (e.g., a metal roof, composite shingle, roof deck, underlayment or insulation layer). Some aspects have improved aesthetics that reduce the visual differences between solar and non-solar portions of the roof. In addition, some aspects cost less to make and install compared to conventional solar systems. These and other embodiments are discussed in greater detail in the detailed description and drawing figures.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive FIG. 1A shows an example of a prior art photovoltaic array installed on a roof.

FIG. 1B shows an exemplary prior art photovoltaic module.

FIGS. 6A-6C show details of side lap features of PV modules, in accordance with embodiments of the disclosure.

DETAILED DESCRIPTION

Figure 2A:
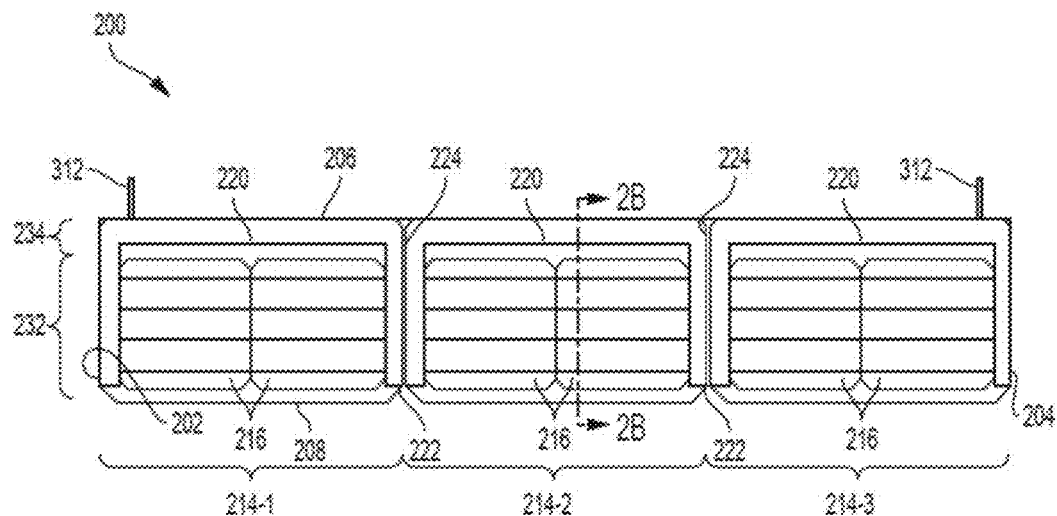
FIG. 2A shows a top view of a PV module, in accordance with embodiments of the disclosure.

The present disclosure describes various embodiments of photovoltaic roofing systems and associated systems and methods. Some embodiments relate to building integrated photovoltaic module assemblies and associated systems and methods. In various embodiments, the systems described herein lower costs of conventional systems in which a photovoltaic ("PV") system is installed over a roof, and at the same time can provide an improved aesthetic for a PV roof system, and particularly a building integrated PV system.

Certain details are set forth in the following description and in the figures to provide a thorough understanding of various embodiments of the present technology. Other details describing well-known structures and systems often associated with PV systems and roofs are not set forth below to avoid unnecessarily obscuring the description of the various embodiments of the present technology.

Many of the details, dimensions, angles and other features shown in the figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical or at least generally similar elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be, for example, by ±5%, ±10%, ±15%, ±20%.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" or "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. Components of a BIPV system used, in part, as the actual building envelope (e.g., roofing membrane), can provide a watertight or substantially watertight seal for the roof surface.

As used herein, the terms "up-roof", "down-roof", "side-roof", "left-roof" and "right-roof" are used to provide orientation, direction, position, or a reference point relative to or in context of a roof or roofing surface upon which the systems described herein are installed on and/or form a portion of Up-roof generally refers to an orientation that is relatively closer to the roof ridge while down-roof refers to an orientation that is relatively closer to the roof eave. Side-ride, left-roof and right-roof generally refers to an orientation that is relatively equidistance to the roof ridge and in line horizontally from the reference element. Embodiments herein may disclose features being on a left or right side of a PV module, or PV array. It is understood that all embodiments may be made as left/right mirror images of themselves and installation can be performed in left/right mirror orientation.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (rotated 90 degrees or at other orientations) and the spatially relative descriptors used herein are interpreted accordingly.

Although the terms "first", "second", etc. may be used herein to describe various elements, components, regions, layers and/or sections, it should be understood that the terms do not connote the number or order of the elements. These terms are used to distinguish one element, component, region, layer, or section from another. Thus, a first element, component, region, layer, or section discussed below could be termed a second element, component, region, layer, or section without departing from the teachings of the present invention.

As used herein, the terms "and/or" and "at least one of" include any and all combinations of one or more of the associated listed items.

In contrast with embodiments of the present disclosure, FIG. 1A shows a prior art PV array installed on roof 100. The exemplary PV array of FIG. 1A includes six framed PV modules 101 which though not shown in detail are mounted on roof 100 using one of various known rail-based or rail-free mounting systems, as are currently employed by solar installers.

FIG. 1B shows one type of conventional PV module 101 in more detail. PV module panel 101 includes glass-on-glass PV laminate 102, which in conventional silicon-based cells, consists of a silicon sandwich of p-doped and n-doped silicon layers, a top glass sheet and a back glass sheet protecting and providing structural support for silicon-based cells, and rigid metal frame 103 around the perimeter providing additional structural support of laminate 102 and providing mounting points for PV module 101. Although shown as a unitary structure, laminate 102 may include a plurality of individual solar cells that are wired together to form a single unit between the sheets of glass. In the example shown in FIG. 1B, frame 103 is a grooved frame with groove 104 surrounding the outer face of frame 103 on all sides. In such a module, groove 104 serves as mechanism for attaching mounting hardware to join modules together and to support the modules over a roof surface. Those of ordinary skill in the art will appreciate that PV module 101 may also have a plain, non-grooved frame. Non-grooved frames are typically interconnected to one another and connected to the roof using connectors that clamp down between the top and bottom edges of the rigid frame.

Although these types of framed PV modules achieve their structural function, they are aesthetically suboptimal and have material usage inefficiencies. First, conventional PV systems, such as that shown in FIG. 1A, are typically installed over an existing roof, and not as part of the existing roof, essentially requiring redundant structures since the PV array will shield most of the portion of the roof that it is installed over from the elements. Second, conventional systems are deemed by some people to be unappealing, having a choppy, discontinuous, and/or extraneous aesthetic. Conventional PV modules usually come in one of two colors: blue, signifying a poly-crystalline silicon structure, and black, signifying a mono-crystalline silicon or thin-film structure. Regardless of whether blue or black modules are used, the difference between the look of the portion of the roof that is covered with solar panels and the remainder of the roof is generally quite dramatic. This contrast can be particularly jarring with a conventional PV system and array mounted on a tile roof. As a result, roofs that are partially covered with solar panels have an aesthetic contrast that can be seen from very far distances due to the difference in reflectivity, elevation, height, and/or color between these two very different surfaces.

The technology disclosed herein includes a plurality of PV cells supported and laminated between a backer, which may be constructed from sheet metal, and a light transmissive top sheet, which form an integrated PV module which has the appearance of a plurality of roof tiles, particularly solar roof tiles. The PV modules can be connected together and placed on an underlying roof structure so that they make up the main surface of the roof, and in particular, a roof visually appearing to be comprised of a plurality of tiles. PV modules as disclosed herein include multiple PV cells, for example six PV cells, which is advantageous compared to installing solar tiles with a single PV cell because larger solar energy collection areas can be installed in a single step while also having the aesthetically pleasing appearance of roof tiles. Further, roof surfaces formed of PV module as disclosed herein are directly affixed to the framing structure of a roof and can be lighter than traditional framed PV module on-roof arrays at least because arrays formed of PV modules as disclosed herein do not have heavy frames and related heavy frame support structures affixed above an existing roof. The PV modules may be electrically connected in strings or other circuits located on an underside of an array of PV modules which is visually appealing at least in that wiring is hidden from view.

PV modules as disclosed herein may be mounted in a related manner as a standard tile roof, for example: securing and sealing underlayment or other sheathing to frame elements of the underlying roof structure, adding battens as needed to portions of the roof frame, installing PV modules to form the main surface of the roof, working around obstacles (e.g., chimneys, skylights, vents, etc.) as needed, and installing ridge and edge tiles in combination with flashing or other trim structures of the roof. The PV modules may have a structural integrity capable of accommodating and supporting the PV cells encapsulated in the PV modules, in terms of weight, heat generated, ability to connect electronics, and retaining strength to serve as a portion of a roof surface. The PV modules may have the visual appearance of a plurality of roof tiles of standard sizes as known in the industry. Further, the PV modules used for systems considered herein can have a wide range of colors to have a similar appearance to traditional non-PV roofing, including, but not limited to, blue, blacks, grays, browns, and natural clay colorations.

FIG. 2A shows PV module 200 for use with the BIPV technology disclosed herein. PV module 200 is generally rectangular in shape and comprises left edge 202, right edge 204, upper edge 206, lower edge 208, outer surface 210 configured to face away from the underlying roof structure, and inner surface 212 configured to face toward the underlying roof structure when installed. PV module 200 comprises individual tile portions 214, which each have the visual appearance of a distinct tile. As shown, PV module 200 includes three tile areas, left tile portion 214-1, center tile portion 214-2, and right tile portion 214-3. Each tile portion may be substantially the same size, or tile portions may have different sizes, and the size of each tile portion may depend on the desired aesthetics of the resulting tile roof. As will be discussed in detail below, in embodiments, PV modules in a BIPV array may have different numbers of tile portions with each tile portion of each PV module having a uniform standard size in order for the PV array to appear to be composed of generally similarly sized tiles. In embodiments the standard size of a tile portion may be between 200 mm and 700 mm wide, and PV module 200 may therefore between 600 mm and 2100 mm wide. Each tile portion 214 includes one or more PV cells 216 laminated between backer 218 and top sheet 220. Elements of PV module 200 may include aesthetic features to distinguish adjacent tile portions 214. For example, as shown in FIG. 2A, lower edge 208 may include notches 222 between each tile portion 214 and visually noticeable gaps 224 between adjacent top sheets 220 of each tile portion 214.

Figure 2B:
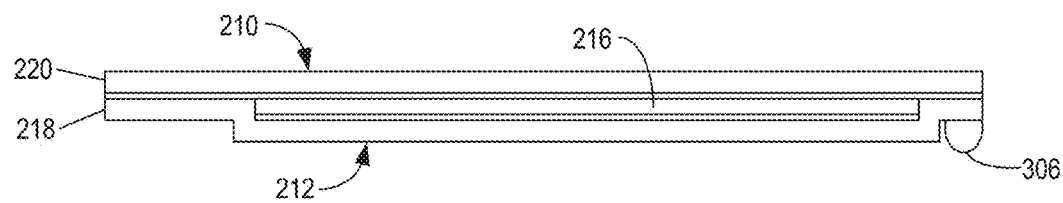
FIG. 2B shows a cross-section of a PV module, in accordance with embodiments of the disclosure.
Figure 2C:
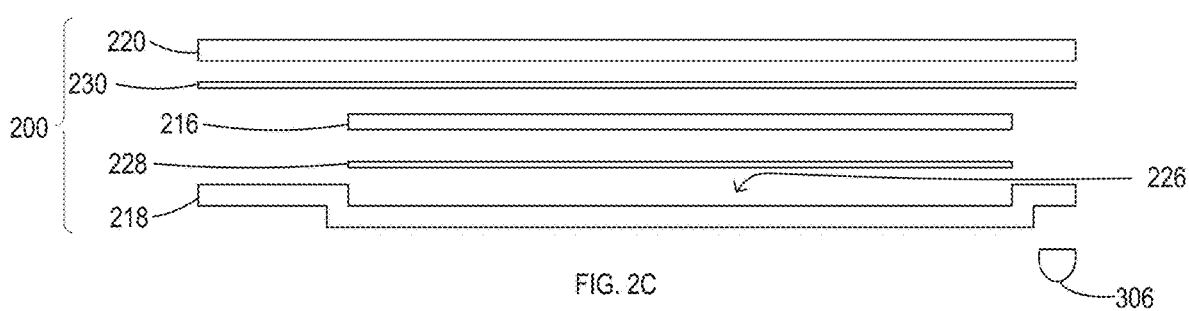
FIG. 2C shows an exploded cross-section of a PV module, in accordance with embodiments of the disclosure.

FIGS. 2B and 2C show a cross-section and an exploded cross-section of PV module 200 of FIG. 2A. The cross-section of FIG. 2B shows that PV cell 216 is laminated between top sheet 220 and backer 218. PV cell 216 can include multiple layers including solar energy collecting layers, semiconductor layers, bussing, and insulation sandwiched between encapsulation layers 228 and 230 when assembled in PV module 200. Encapsulation layers 228 and 230 are light transmissive, including transparent, and may be for example ethylene-vinyl acetate (EVA). In embodiments, PV cells 216 are crystalline-based which can be either or both of monocrystalline or polycrystalline (multi-crystalline). As shown the laminate or wafer forming the solar energy-collecting PV cells 216 is bonded to top sheet 220 and backer 218 providing structural support and protection of PV cell 216 when assembled as a roof surface. In embodiments, PV cells 216 may comprise thin-film PV materials, such as cadmium telluride, copper-indium-gallium-diselenide ("CIGS"), or amorphous thin-film silicon. Further, in embodiments PV cells 216 may comprise perovskite or other currently known but not yet commercialized materials. The particular type of PV cell technology used for any given installation can be selected both for solar energy collecting functionality and for aesthetic qualities, as related to the present disclosure.

FIG. 2C shows details of layers of PV module 200 in an exploded cross-section. As shown, backer 218 forms a bottom layer of the assembly. Backer 218 may be formed of sheet metal and features of backer 218 as disclosed herein may be formed with sheet metal forming techniques known in the art. The sheet metal used to form backer 218 may be steel and have a thickness of between 1 mm to 4 mm.

As shown in FIG. 2C, backer 218 includes recess 226 and PV cell 216 is positioned within recess 226 and adhered to backer 218 with encapsulation layer 228 which is located between backer 218 and PV cell 216. Encapsulation layer 228 may generally have the same dimensions as recess 226. Recess 226 may be formed in sheet metal of backer 218 in a stamping process. Top sheet 220 forms a top layer of PV module 200 and is adhered to both backer 218 and PV cell 216 with encapsulation layer 230. Encapsulation layer 230 may be substantially the same dimension as top sheet 220. Top sheet 220 is light transmissive, and may be substantially transparent, and is configured to allow solar energy to reach PV cells 216. Top sheet may be made of glass or transparent plastic. Once PV module 200 is assembled in layers as shown in FIG. 2B, the assembly may be laminated so that PV cells 216 are encapsulated within recess by backer 218 and top sheet 220. In previous technologies, PV cells were laminated between a glass back layer and a glass top layer, referred to as "glass on glass". Glass on glass PV modules could be heavy, fragile, and typically require a heavy frame and corresponding heavy roof mounting hardware. A sheet metal backer as used in PV modules as disclosed herein is lighter and provides resiliency and strength while also providing fire protection between PV cells and the underlying roof structure. Also, PV modules 200 are generally frameless around the perimeter. This frameless aspect is in contrast to framed PV modules, which gain substantial rigidity from the frame. The backer in PV modules as disclosed herein provides the structural support given by frames in traditional framed PV modules. In other words, PV modules can be constructed without a rigid frame (e.g., made of metal, plastic) surrounding or enclosing the edges of the backer and top sheet laminate.

As will be discussed below in relation to FIGS. 4A-4F, PV modules 200 are installed above an underlying roof structure to form a roof surface in an overlapping manner. The down-roof portion of PV module 200 is referred to as reveal portion 232 and the up-roof portion of PV module 200 is referred to as overlap portion 234 because when PV module 200 is installed as a roof surface reveal portion 232 is visible by an outside observer and overlap portion 234 is covered by undersides of reveal portions of up-roof PV modules. In embodiments, reveal portion 232 comprises 50%-90%, and overlap portion 234 comprises 10%-50% of the up-roof/down-roof direction of PV cell 200. Larger ratios of reveal portions to overlap portions are beneficial in reducing total material, and therefore weight of costs, of each PV module.

Figure 3A:
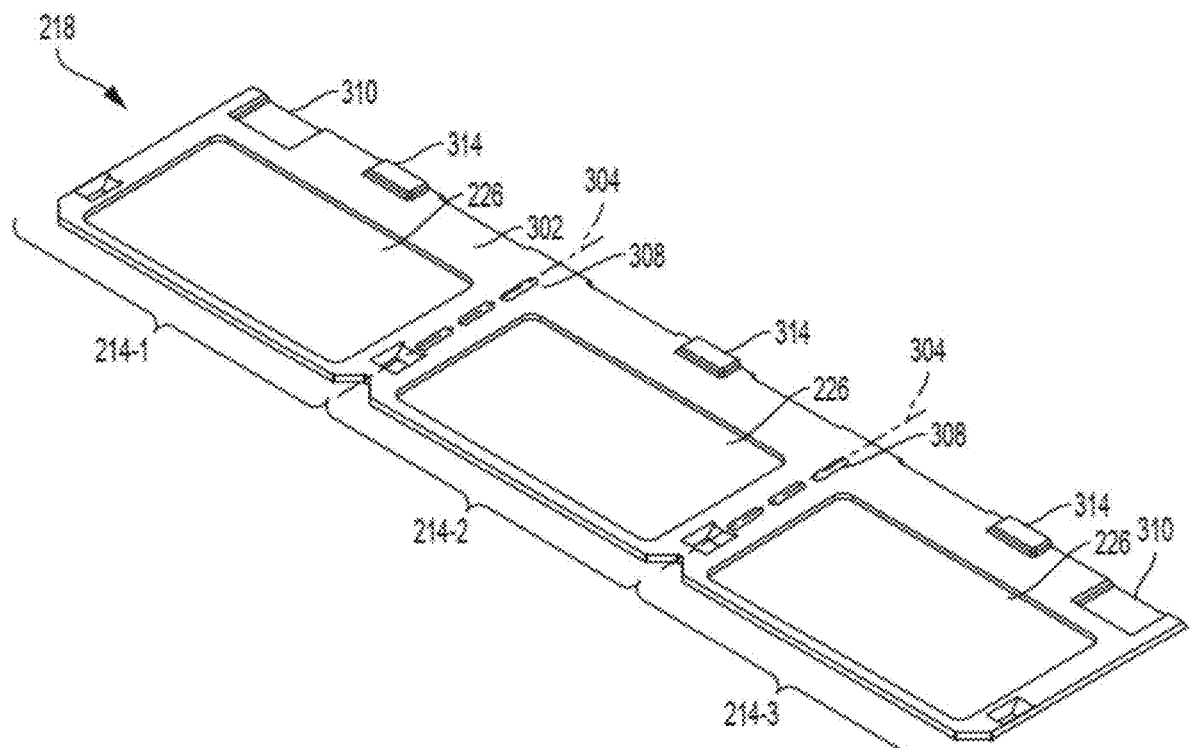
FIG. 3A shows a top perspective view of a backer, in accordance with embodiments of the disclosure.

FIG. 3A shows a perspective view of backer 218. Backer 218 includes three recesses 226 corresponding to each tile portion 214. In embodiments, backer 218 may have any number of tile portions 214, and any number of recesses 226 per tile portion. Recesses 226 have a depth corresponding to the thickness of PV cell 216 and encapsulation layer 228 used to laminate PV module 200 during assembly. For example, in embodiments PV cells 216 may have a thickness in the range of 0.1 mm to 1 mm and recesses 226 may have a depth of 0.1 mm to 2 mm or more. Recesses 226 further have a length and a width corresponding to dimensions of one or more PV cells 216 received within recesses 226. For example, as shown in FIG. 2A, two PV cells 216 are received in each recess 226. PV cells 216 may be square with 125 mm sides, and recesses 226 may have dimensions of 125 mm by 250 mm. In embodiments, recesses may receive any number of PV cells. In embodiments, PV cells of shapes other than square may be used and recesses may be shaped and sized to accommodate corresponding PV cells.

As shown in FIG. 3A, backer 218 has upper surface 302 which surrounds openings of each recess 226. As shown, in embodiments each recess 226 is generally centered in the left and right directions in each tile portion 214. Further, portions of upper surface 302 are present on both the up-roof and down-roof sides of recesses 226. With this arrangement upper surface 302 of backer 218 includes portions on each side of recesses 226. As shown, upper surface 302 may be a continuous surface across each tile portion 214. In embodiments, upper surface 302 may have a dimension of 10 mm between each recess 226 and lower edge 208, 15 mm between each recess 226 and left edge 202 or right edge 204, 25 mm between each recess 226 and upper edge 206, and 12 mm between each recess 226 and tile portion boundaries 304. The width of the perimeter of upper surface 302 around each recess 226 may be selected to provide an adhesion surface area for a strong structural and waterproof seal of PV cell 216 between backer 218 and top sheet 220.

Top sheets 220 are sized to cover at least a portion of, and in embodiments the entirety of, each tile portion 214. In embodiments, for each tile portion 214 top sheet 220 may completely cover recess 226 and the entire portion of upper surface 302 in each tile portion 214. In embodiments, for each tile portion 214 top sheet 220 may completely cover recess 226 and only a partial portion of upper surface 302 corresponding to reveal portion 232 of tile portion 214. Top sheet 220 may extend partially into overlap portion 234 of tile portion 214 in order for sealing member 306 on lower edge of an up-roof PV module to contact and form a seal with top sheet 220.

Top sheets 220 of each tile portion 214 may be separated from top sheets 220 of adjacent tile portions 214 by gap 224. Gap 224 may be for example between 0.5 mm to 3 mm. Gap 224 may be filled with a flexible sealing material, for example silicone, to prevent ingress of water between top sheet 220 and backer 218. Additionally, as noted above, gap 224 and sealing material may assist in giving each tile portion 214 the visual appearance of a distinct roof tile, despite the fact that multiple tile portions 214 are integrated into a single PV module. By providing separate top sheets 220 for each tile portion 214, PV module 220 may flex at boundaries 304 of tile portions 214 between PV cells 216. The flexibility may be established through selection of the material and thickness of backer 218, and additionally by the presence of flex slots 308 in backer 218 at tile portion boundaries 304 which may be sized to give PV module 200 a desired flexibility. Flex slots 308 may be formed in a stamping process to remove material during the manufacture of backer 218. Flexibility of backer 218 allows for PV module 200 to contour to unevenness of underlying roof structures without concentrating stress on PV cells 216. Further, flexibility is beneficial in preventing stress and therefore damage to PV cells 216 during transport and handling during installation. In embodiments, PV module 200 may include a single top sheet covering a plurality of tile portions, for example a single light transmissive top sheet may cover the three tile portions of a PV module. In embodiments, top sheet may be made of a flexible material.

As shown in FIG. 2A, PV module 200 may have two PV cells 216 in each recess 226. In embodiments, recesses 226 may include, one, two, three, four, or more PV cells 216, or no PV cells, as will be discussed below regarding non-PV modules. The number of PV cells per recess may be different or the same for each recess in a PV module or for recesses in different PV modules in an array.

Backer 218, particularly upper surface 302, may be colored for example with a coating, for aesthetic and/or functional purposes. For example, backer 218 may be colored similarly to PV cells 216 in order to give PV module 200 a uniform appearance when installed as a roof covering. Non-white colors can improve aesthetics by reducing glare or reflection off or through top sheet 220. In embodiments, backer 218 may be coated in in a blue or black coating to match coloring of conventional solar energy collecting material used in PV cells 216. Additionally, materials and/or coatings of backer 218 can be selected for thermal dissipation or heat reflective properties, electrical insulation, or protection from damage, moisture, or UV degradation.

PV cells 216 in PV module 200 may be electrically connected to each other, for example, in series, parallel, or a combination of the two. Wiring for electrically connecting PV cells 216 within PV module 200 may be laminated between backer 218 and top sheet 220. Embedded wiring in each PV module 200 electrically connected to PV cells 216 allows for modular assembly of PV modules with reduced need for additional wiring or external components. In embodiments, backer 218 may include electrical component embosses 310 along upper edge 206 and extending out from upper surface 302, as shown in FIG. 3A. Electrical component embosses 310 may house module level electrical distribution components, for example junction boxes, micro-inverters, and DC optimizers. As will be discussed below, when PV modules 200 are installed as a roof, electrical component embosses 310 will be covered by up-roof PV modules and hidden from view. In embodiments, electrical leads 312 electrically connected to PV cells 216 and/or module level electrical distribution elements may extend from electrical component embosses 310 and be connected to leads of adjacent PV modules to form a string of PV cells 216 across multiple PV modules. In embodiments, leads 312 may be connected to electrical distribution wiring installed on a roof surface prior to installation of an array of PV modules 200.

Figure 3B:
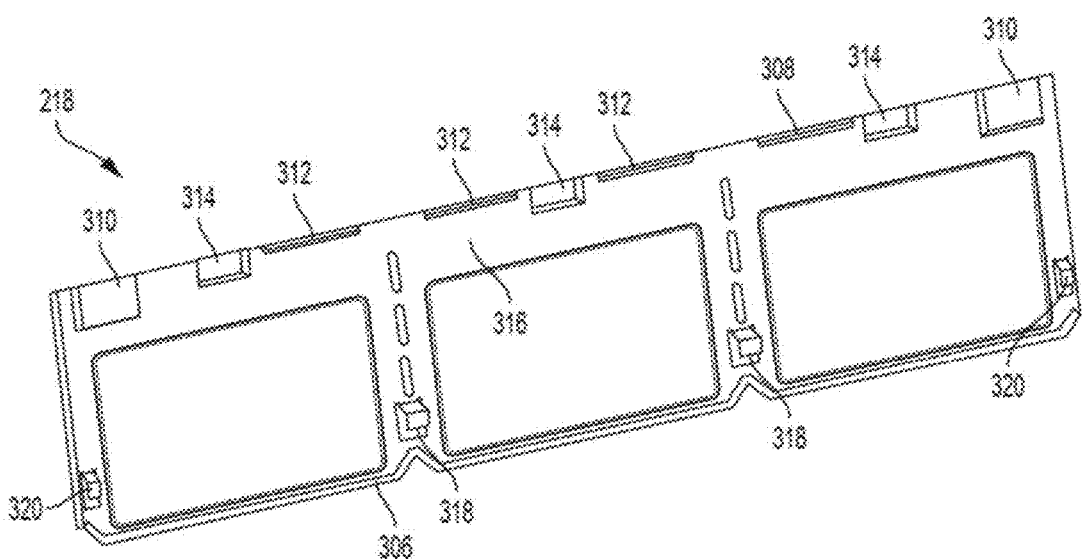
FIG. 3B shows a bottom perspective view of a backer, in accordance with embodiments of the disclosure.
Figure 3C:
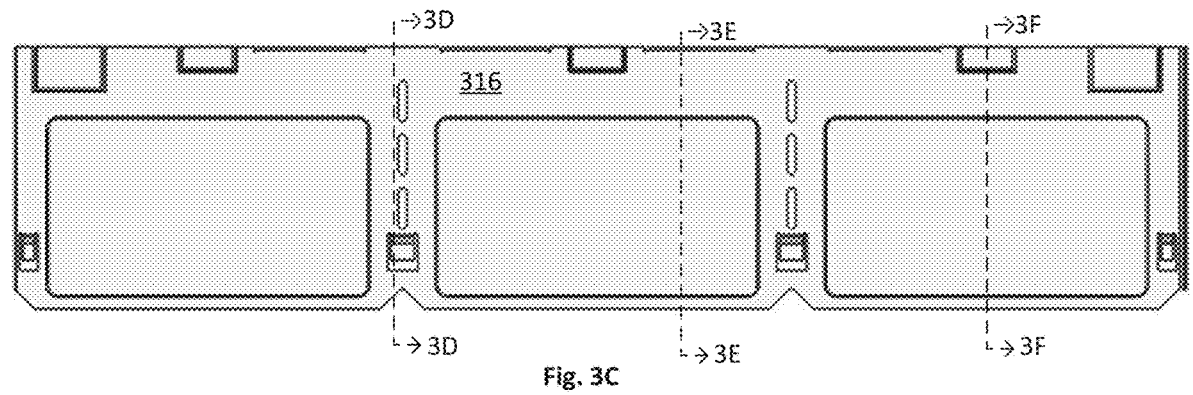
FIG. 3C shows a top view of a backer, in accordance with embodiments of the disclosure.
Figures 3D, 3E, 3F:
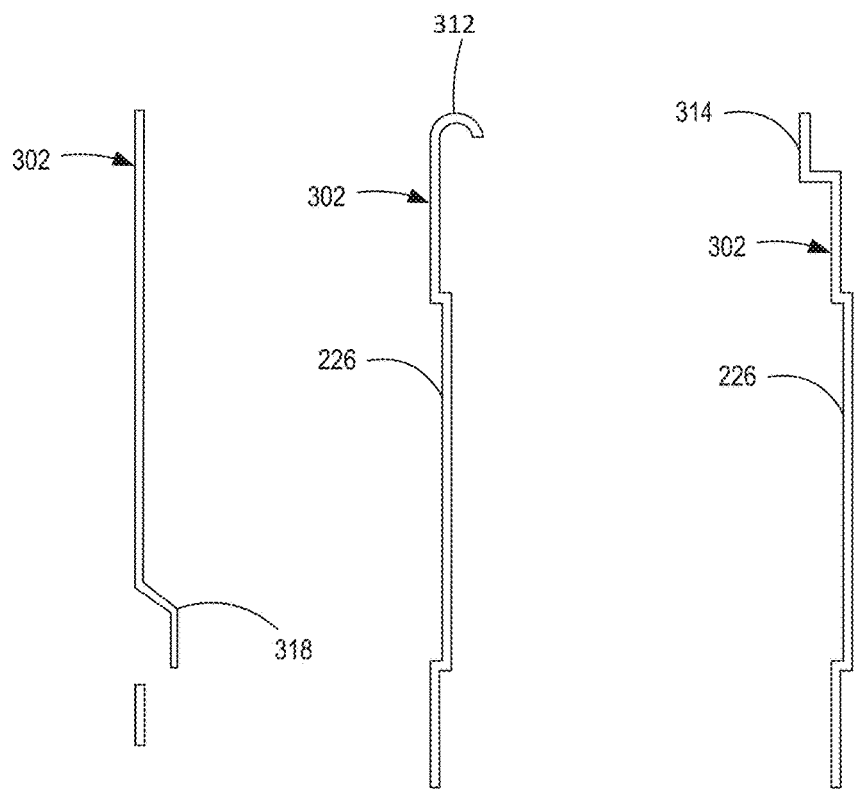
FIGS. 3D-3F show cross-section views a backer, in accordance with embodiments of the disclosure.

Backer 218 may further include features for securing PV module 200 to an underlying roof structure. As shown in FIG. 3B, backer 218 includes a plurality of batten hooks 312 across upper edge 206. As shown in cross-section of FIG. 3E, batten hook 312 extends from upper edge 206 in a direction away from lower surface 316 and are curved toward lower edge 208 to form a hook shape. As will be discussed in further detail in relation to FIGS. 4A-4F, batten hooks 312 engage battens on an underlying roof structure to secure upper edge 206 of PV modules 200 to an underlying roof structure. With upper edges 206 secured to an underlying roof structure lower edges 208 of PV modules 200 may be prone to uplift, for example due to wind. Accordingly, in embodiments backer 218 includes features for preventing uplift. For example, in embodiments backer 218 includes retaining embosses 314 along upper edge 206 extending out of lower surface 316, and retaining hooks 318 toward lower edge 208 between recesses 226 and extending away from lower surface 316, as shown in FIGS. 3B, 3D and 3F. When installed on a roof surface, retaining hooks 318 are configured to be received by and engage retaining embosses 314 of down-roof PV modules, as will be discussed in greater detail below. Retaining hooks 318 may have a width of 8 mm and retaining embosses may have a width of 15 mm. As shown in FIG. 3B, backer 318 further includes side retaining hooks 320 adjacent to left-side and right sides 202 and 204. Side retaining hooks 320 are narrower than retaining hooks 318, and may be for example half the width or less and be between 3-5 mm wide. In an array, side retaining hooks of side-roof adjacent PV modules may be received within the same retaining emboss of a down-roof PV module. As shown in FIG. 3A, retaining embosses 314 are offset in the horizontal direction from retaining hooks 318 in order to prevent seams of horizontal courses of PV modules from lining up with seams of up-roof and down-roof courses of PV modules.

FIGS. 4A-4F show an example assembly procedure for forming a BIPV roof comprised of PV modules 200 disclosed above. PV modules 200 may be installed in a plane to form a watertight or substantially watertight envelope above underlying roof structure 400. PV modules 200 are arranged in horizontal rows, referred to as courses 402, along the width of underlying roof structure 400. Vertically adjacent courses of PV modules may be offset from each other by about half the width of each PV module such that seams or breaks between two vertically adjacent rows of PV modules do not form a single seam or break along the full slope of roof surface, but rather form an alternating pattern of seams, where breaks between adjacent PV modules are relatively equidistant from each other. The offset pattern of seams provides better weatherproofing, and more secure attachment of PV modules to roof surface. Before, during, or after PV modules are installed, additional roofing elements, including ridge flashing at the top of roof surface and eave flashing at the bottom of roof surface may be installed to form a complete roofing system.

Figure 4A:
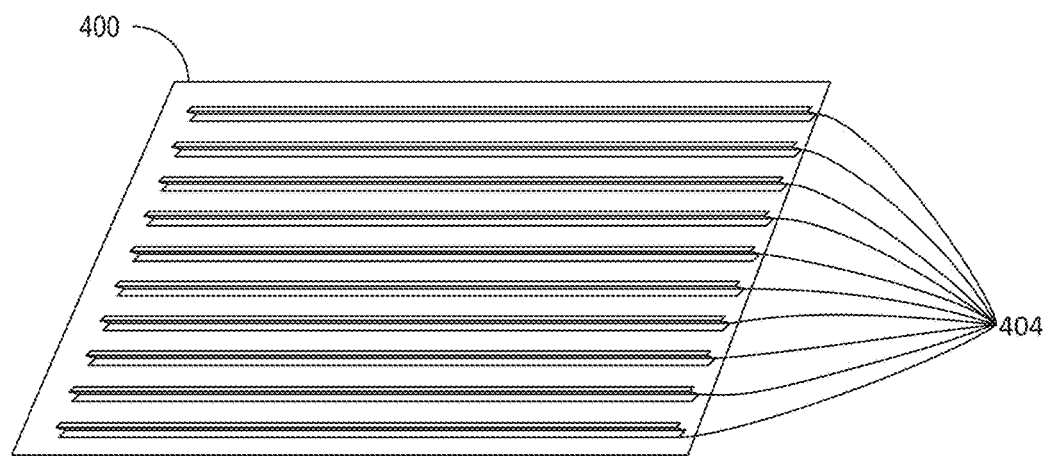
FIGS. 4A-4F show exemplary steps for installing PV modules on an underlying roof structure, in accordance with embodiments of the disclosure.
Figure 4B:
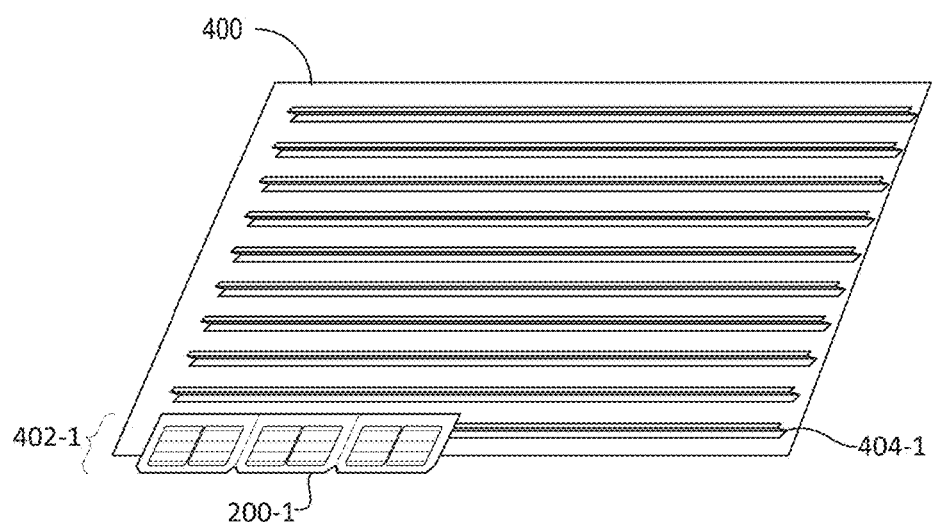
Figure 4C:
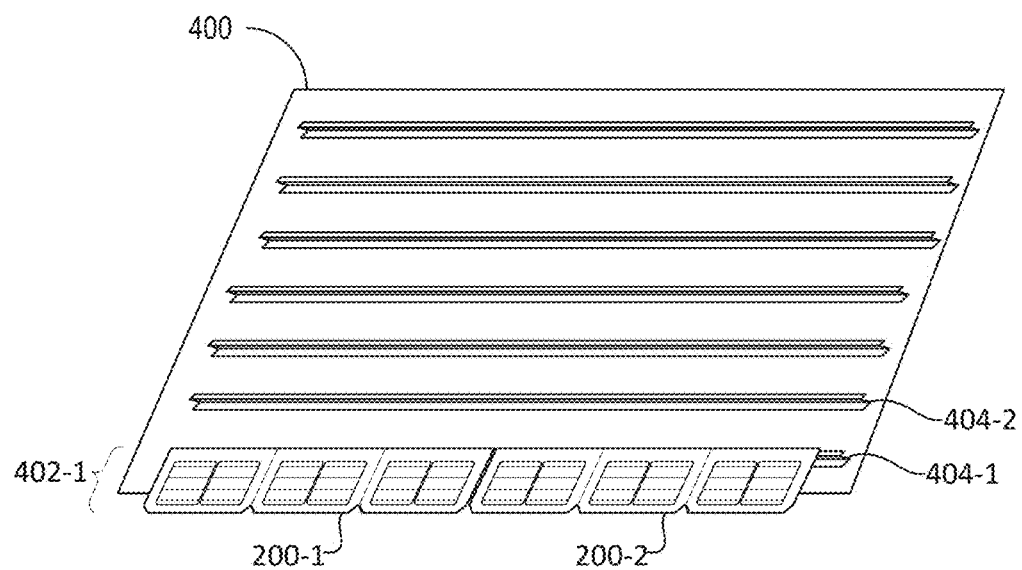
Figure 5A:
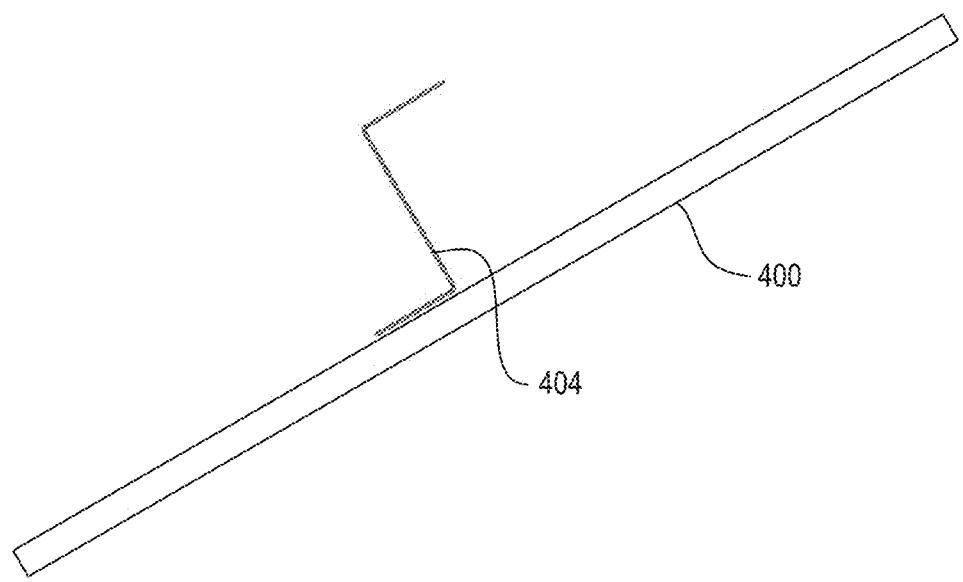
FIGS. 5A-5D show battens and PV modules installed on battens, in accordance with embodiments of the disclosure.
Figure 5B:
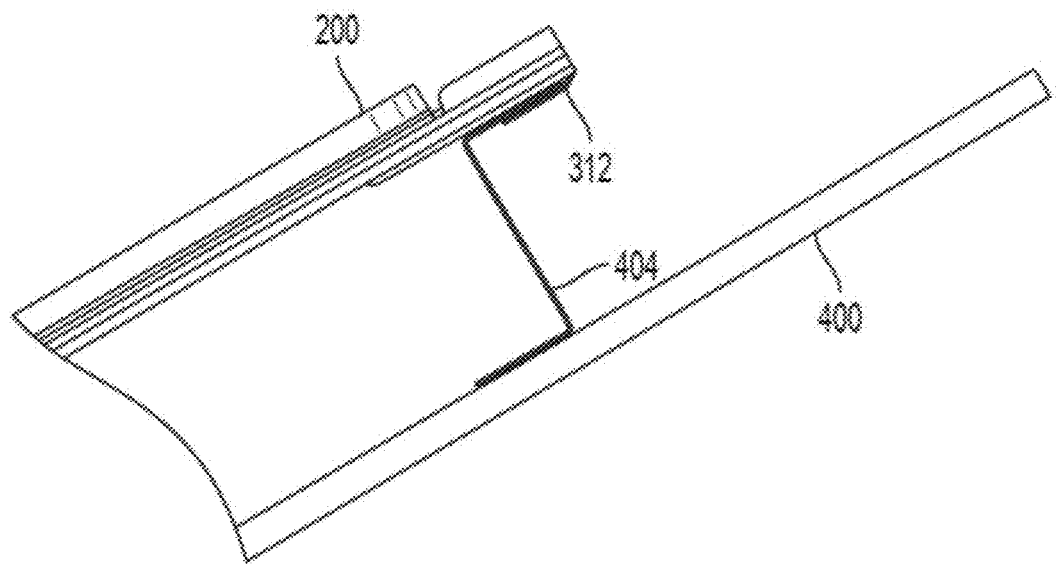
Figure 5C:
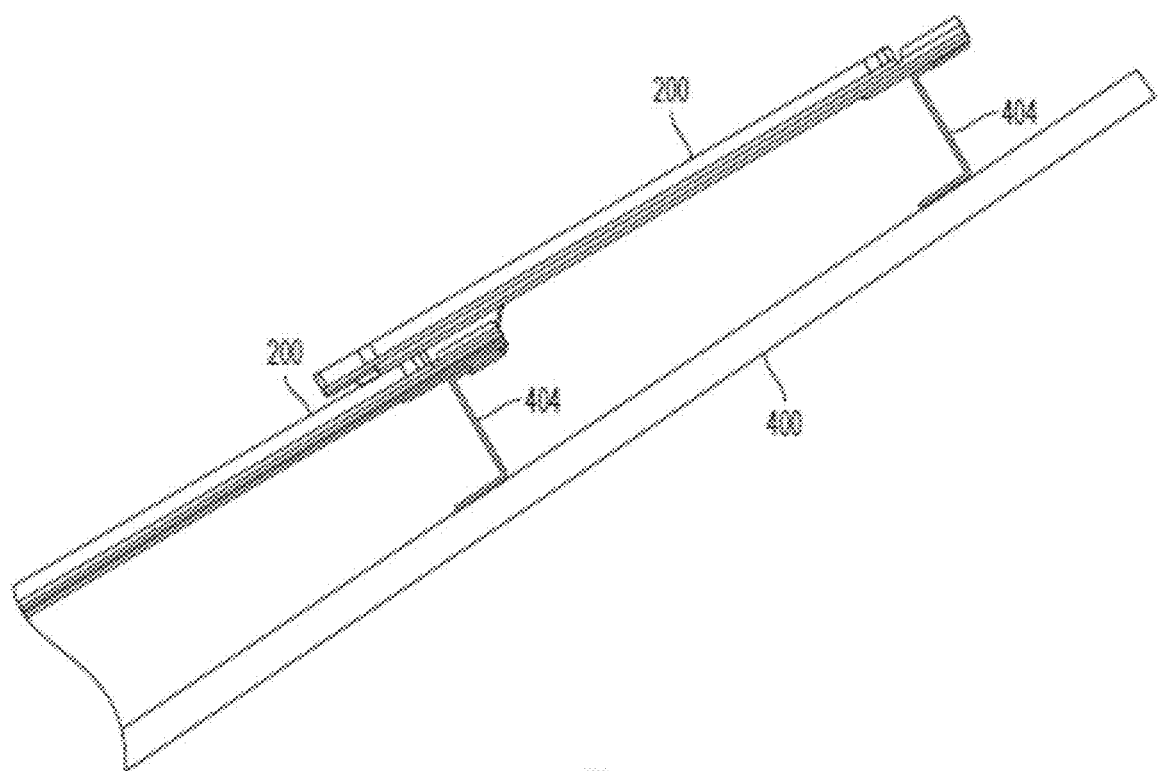
Figure 5D:
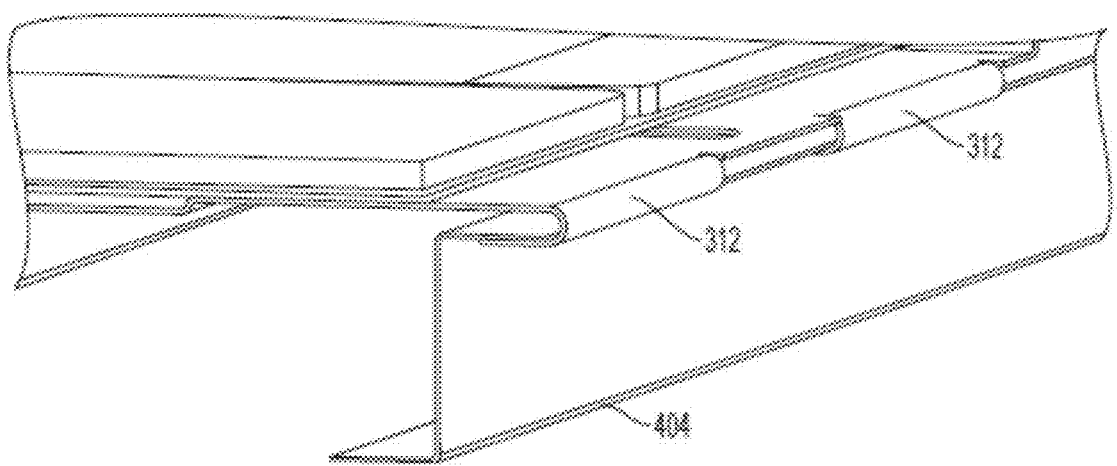

FIG. 4A shows a step of forming a BIPV roof system comprising securing a plurality of battens 404 to underlying roof structure 400. In embodiments battens may have a Z profile, as shown in FIG. 5A, or other profiles shapes, such as a C profile. The distance between battens on underlying roof structure 400 corresponds to the dimension of reveal portion 232 of PV modules 200. For example, spacing may be between 125 mm to 500 mm or more. As shown in FIG. 4B, a subsequent step of forming a BIPV roof system is to hook batten hooks of first PV module 200-1 onto lowest batten 404-1 on underlying roof structure 400. FIGS. 5B-5C show views of batten hook 312 of PV module 200 engaging batten 404. As shown in FIG. 4C, when first PV module 200-1 of first course 402-1 is secured to batten 404-1 second PV module 200-2 of the same course can be hooked onto batten 404-1 left-roof adjacent to first PV module 200-1 in order to extend first course 402-1. As shown in FIGS. 6A-6C in embodiments, backer 218 may include lower lap joint portion 602 on right edge, FIG. 6A, and upper lap joint portion 604 on left edge, FIG. 6B. With this configuration PV modules are assembled in a course along a batten from left to right so that upper lap joint portion 604 of each additional PV module 200 is received in lower lap joint portion 602 of already installed PV module 200. One or both of upper and lower lap joint portions may include a sealing element, for example a silicone gasket, to create a weatherproof seam between PV modules in a course. Additional PV modules of a course may be installed by repeating the step shown in FIG. 4C.

Figure 4D:
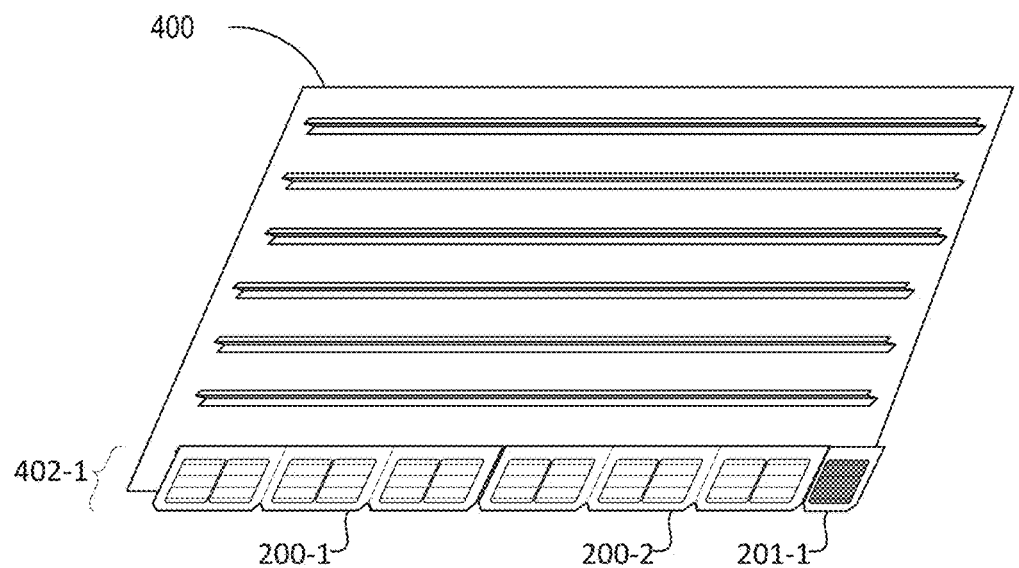

During installation, situations may occur where the width of an underlying roof structure is not an integer multiple of the width of the standard sized PV modules being used. In these situations PV modules, or non-PV modules as will be discussed below, having different widths than the standard sized PV module may be used in order for the course to have a width substantially matching the underlying roof structure width. In embodiments, PV modules may have any number, including non-integer numbers, of standard width tile portions. For example, embodiments include PV modules with 0.25, 0.5, 1, 1.5, 2, and 2.5 standard width tile portions. As shown in FIG. 4D, the intended width of roof surface corresponds to 6.5 standard width tile portions. As shown, first course 402-1 includes first PV module 200-1 and second PV module 200-2, which in this embodiment are standard sized PV modules each including three tile portions. In order to complete first course 402-1 to span the width of underlying roof structure 400 a third PV module 201-1 comprising half a tile portion is used. PV modules including half tile portions may include a recess with a single PV cell.

Figure 4E:
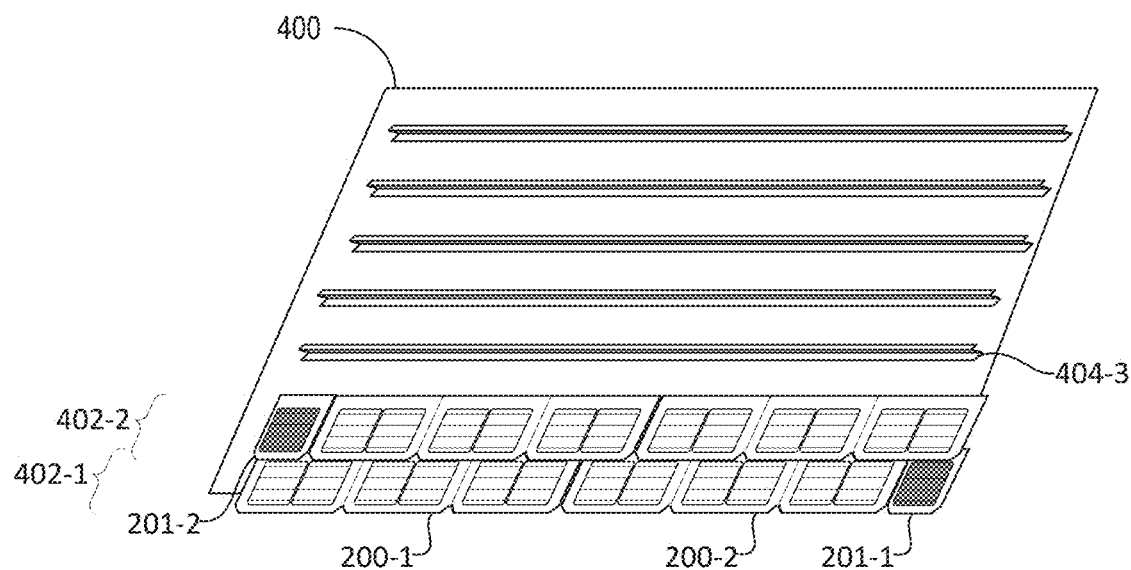
Figure 4F:
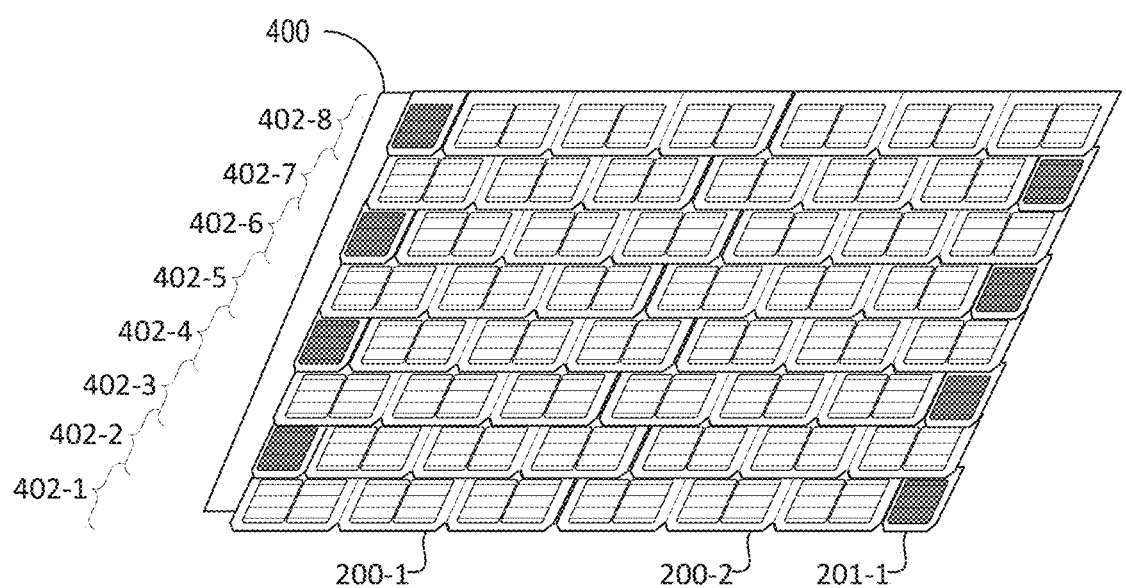

As shown in FIG. 4E, after or while course 402-1 of down-roof PV modules are installed, course 402-2 on the adjacent up-roof batten can be installed. As shown, seams between PV modules of up-roof adjacent courses are offset in the left-roof/right-roof direction. In the example shown in FIG. 4E, second course 402-2 may be installed starting from the left side of underlying roof structure 400 with half tile portion PV module 201-2. With this arrangement second course 402-2 of PV modules are offset from first course 402-1 of PV modules by about half the width of a standard size tile portion. As shown in FIG. 4F, by repeating this offsetting for each course seams or breaks between two vertically adjacent rows of PV modules do not form a single seam or break along the full slope of roof surface, but rather form an alternating pattern of seams.

Figure 5E:
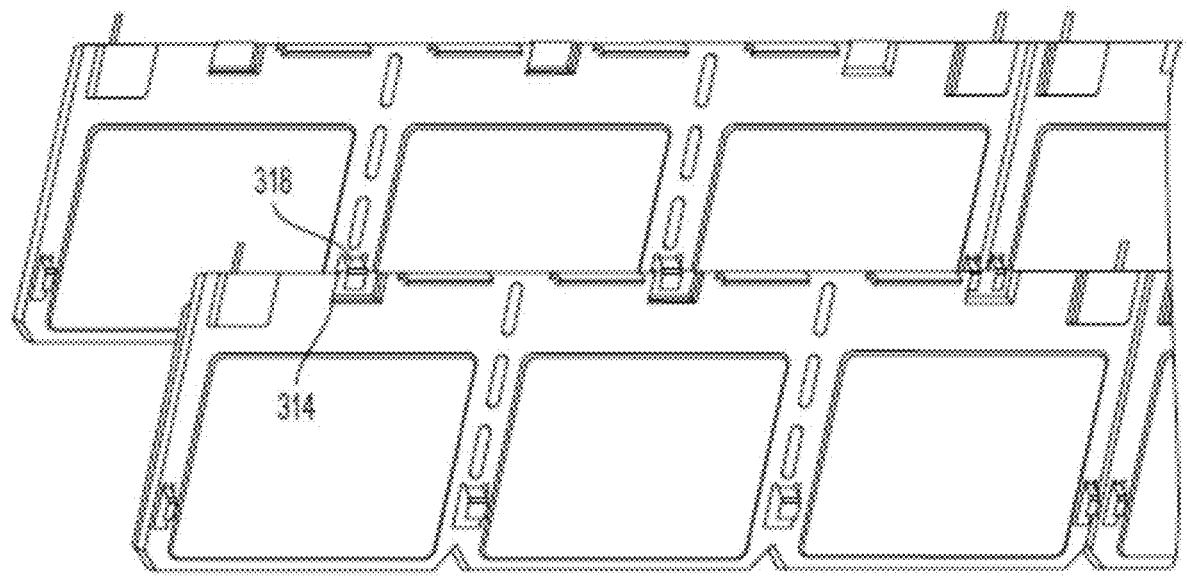
FIGS. 5E and 5F show bottom views of an assembly of PV modules with the underlying roof structure omitted for clarity, in accordance with embodiments of the disclosure.
Figure 5F:
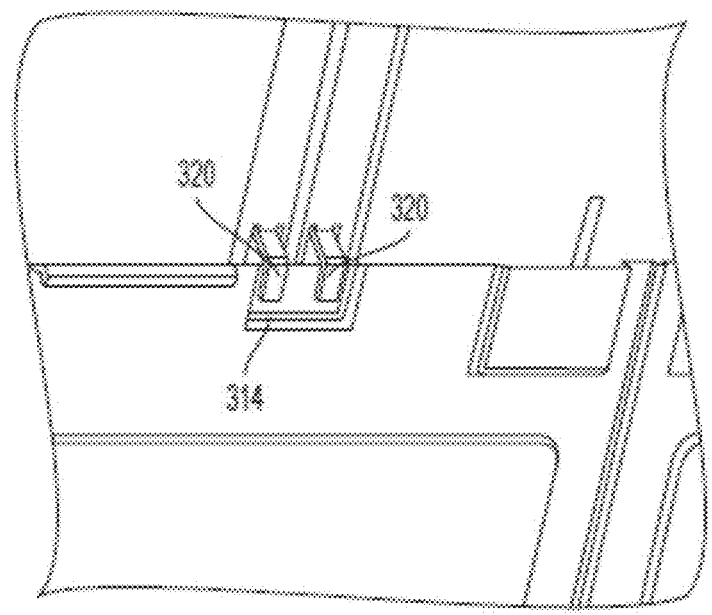

FIG. 5E shows the bottom side of two courses of an installed PV array, with the underlying roof structure and battens omitted in order to show engagement of retaining hooks 318 and retaining embosses 314. As shown, when PV modules 200 are installed as a roof surface retaining hooks 318 of up-roof courses are received by retaining embosses 314 of down-roof courses. As shown, retaining embosses 314 may be wider than retaining hooks 318 which provides the advantage of allowing for slight misalignments which may occur due to unevenness in the underlying roof structure. As shown in detail in FIG. 5F side retaining hooks 320 of adjacent PV modules in up-roof course are received by single retaining emboss 314 of PV module of down-roof course. With this arrangement of retaining hooks, top edges of PV modules are held to the underlying roof structure by battens, and lower portions are held down by retaining hooks engaging retaining embosses of down-roof PV modules, which are in turn secured to the underlying roof structure by down-roof battens. Further, in embodiments, lap joints as shown in FIGS. 6A-6C and discussed above may provide additional hold for preventing uplift.

As noted above, a BIPV may include non-PV modules. For example, not every portion of a roof may be amenable to, or need to be used for, solar energy generation. Therefore, in addition to PV modules, for example as shown in FIG. 2A, a roof surface may additionally include non-PV modules. Non-PV modules may have an identical or near identical appearance to PV modules as disclosed herein. Non-PV modules may be manufactured in a similar manner as PV modules, as discussed above, and include backer 218, and top sheets 220. Further, in embodiments non-PV modules may include mock PV cells, for example a patterned decal or a silicon element that appears similar to a PV cell laminated between backer 218 and top sheet 220.

Figure 7A:
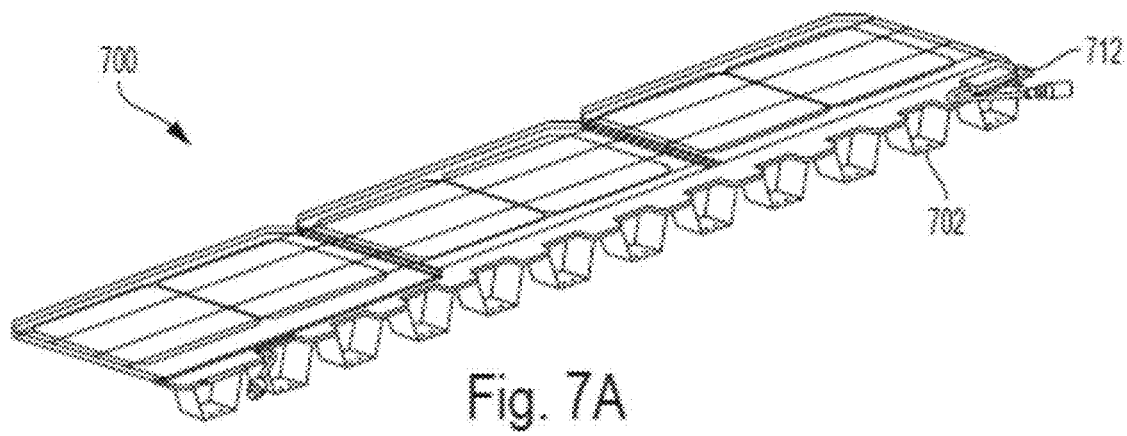
FIGS. 7A-7H show views of a PV module including a corrugated standoff, in accordance with embodiments of the disclosure.
Figure 7B:
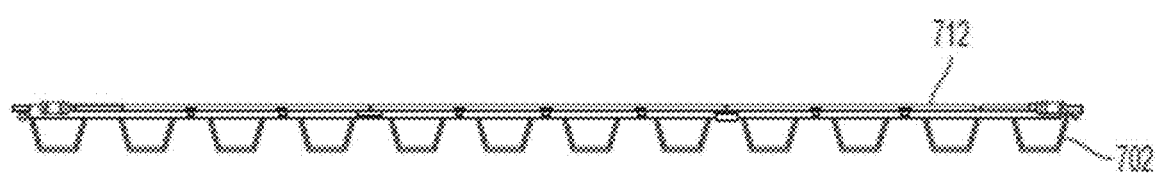
Figure 7C:
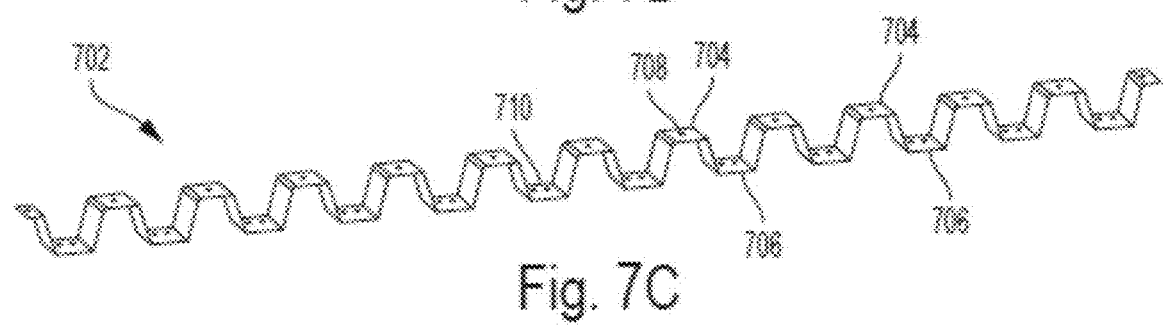
Figure 7D:
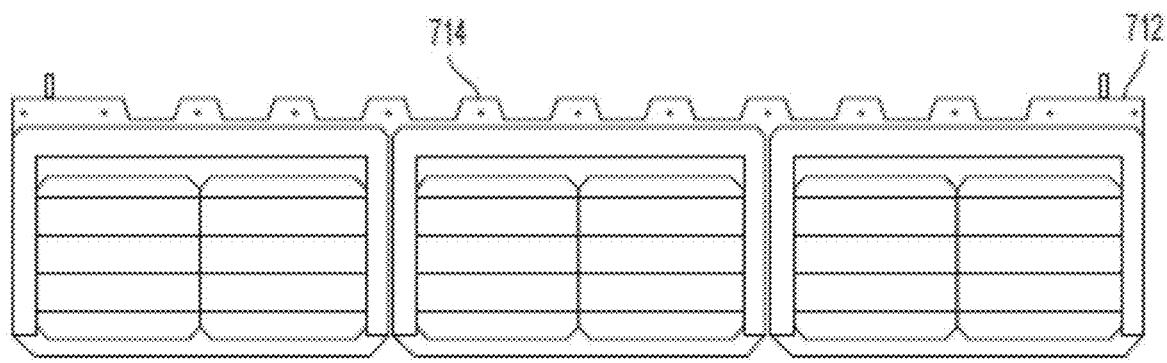
Figure 7E:
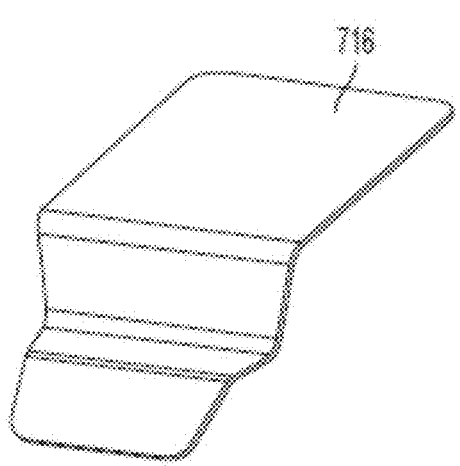
Figure 7F:
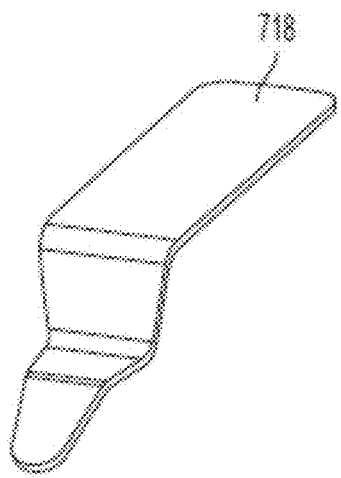

FIGS. 7A-7H show aspects of exemplary PV module 700 including corrugated standoff 702 that is used to attached PV module to an underlying roof structure. Corrugated standoff 702 may include a plurality of peaks 704 and valleys 706, as shown in FIG. 7C. Peaks 704 may include flat upwardly facing portions configured to be attached to backer 712. Flat portions of peaks 704 may include holes 708 for attachment to backer 712. Valleys 706 may include flat portions configured to contact to an underlying roof structure and support the weight of PV module 700. Flat portions of valleys 706 may include holes 710 configured to receive fasteners to be inserted in the underlying roof structure. Standoff 702 may be made of sheet metal, for example galvanized steel. Standoff 702 may be corrugated through stamping or roll corrugation processes. Standoff 702 may include sheet metal gussets to increase rigidity.

As shown in FIG. 7A, PV module 700 includes backer 712 that is similar to backer 218 described above relating to FIGS. 3A-3F. As shown, backer 712 includes notched top edge 714. Notches and tabs of notched top edge 714 correspond to flat portions of peaks 704 of standoff 702. Tabs of notched top edge 714 may be attached to standoff 702 with fasteners, e.g. rivets or bolts, or adhesive. Further, notches of notched top edge 714 provide access to flat portions of valleys 706 in order to use fasteners to attach the assembly of backer 712 and standoff 702 to an underlying roof structure.

Figure 7G:
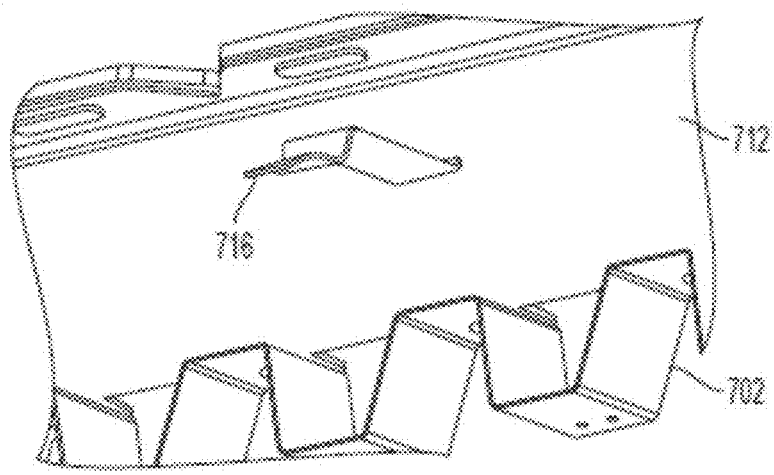
Figure 7H:
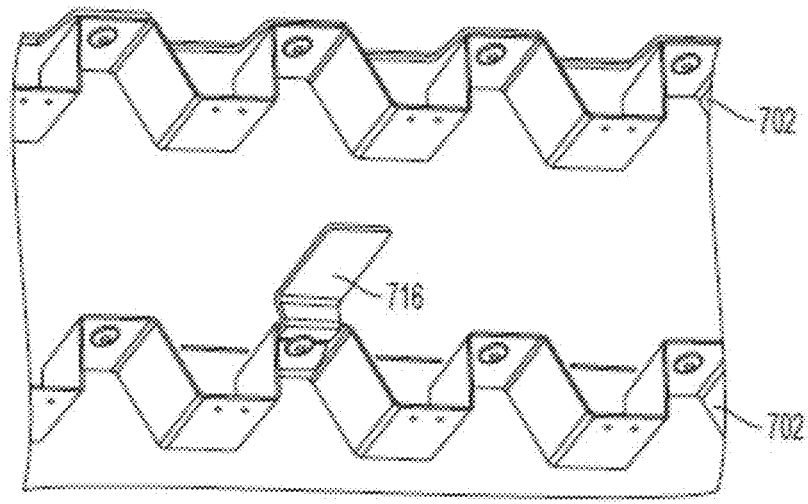

Backer 712 may have clips 716 and 718, as shown in FIGS. 7E-7H, attached to a roof facing side. Clip 716 may be a first width and clip 718 may be a second width narrower than the first width. Clips 716 and 718 may be attached to an underside of backer 712, as shown in FIG. 7G. Clips 716 and 718 may be adhered, welded, or fastened to backer 712 toward a down-roof edge, as shown in FIG. 7G. Clips are positioned and spaced according to the spacing of peaks 704 and valleys 706 of standoff 702 so that when installed as a roof surface clips of an up-roof PV module are received within the undersides of peaks 704 of standoff 702, as shown in FIG. 7H. In this configuration up-roof PV modules overlap portions of down-roof PV modules, and uplift of up-roof PV modules is prevented by engagement of clips with down-roof standoffs.

PV module 700 may be installed as a roof surface in a similar way as discussed in FIGS. 4A-4F. For example, a first down-roof course may be attached to an underlying roof structure followed by engaging clips 716 of PV modules 700 of a second up-roof course with peaks 704 of standoffs 702 of the first down-roof course. Once clips 716 are engaged, PV modules 700 of the second up-roof course may be attached to the underlying roof structure using fasteners through holes 710 of standoff 702. The corrugated structure of standoff 702 allows for improved airflow in the up-roof/down-roof direction under the installed roof surface.

As used herein, PV modules and non-PV modules may be referred to collectively as roof modules. During installation of a BIPV roof it may be advantageous to use a combination of different shapes and sizes of roof modules, for example to manages obstacles or complete courses. Unlike the example shown in FIGS. 4A-F, which include a rectangular roof section free of obstacles, a roof section may include obstacles, for example skylights, chimneys, vents, dormers, hips and valleys. The obstacles may have shapes and distributions that do not correspond to the arrangement of courses and/or the size of standard size tile portions as disclosed above. In order to manage such obstacles, as noted above, roof modules may be of any width including any number of tile portions. Additionally, roof modules may be formed in various shapes configured to manage obstacles. For example, roof modules may be squares, rectangles, rhombuses, trapezoids, or triangles. In embodiments, roof modules may be trimmed to precise shapes and sizes during installation to accommodate obstacles and may include straight and/or curved sides. For example, a half circle may be cut out of a roof module to fit around one side of a plumbing vent pipe.

In addition to completing courses, and managing obstacles, non-PV modules may be used when a PV module is not economically efficient. A roof may include portions that receive substantially different amounts of incident solar energy over the course of a day. For example, in the Northern hemisphere a South-facing portion of a roof may receive substantially more solar energy than a North-facing portion. Further portions of a roof may be occluded from receiving sunlight over the course of the day, for example due to trees, other roof portions, or nearby buildings. The amount of energy PV modules in these areas may not justify the costs of the PV modules. Therefore, these areas may be installed with non-PV modules that allow for the entire roof to have a consistent aesthetically attractive appearance, without the added costs of inefficient PV module placements. Additionally, non-PV modules may also be used for example on non-occluded portions of a roof in cases where a desired power output is achieved with PV modules on only a portion the non-occluded roof.

In embodiments electrical connections on the underlying roof structure may be installed prior to PV module installation. The electrical connections may be located beneath PV modules when PV modules are installed. The underlying roof structure may have voltage or current inverters, power meters, electrical drops, optimizers, transformers, or the like attached to it, which one or more courses of PV modules are electrically coupled and which can then route electricity into an electrical main of the building or toward the electrical grid. In embodiments, PV modules in a course may each electrically couple to power bus bars running along the course and attached to the underlying roof structure. In embodiments, PV modules are electrically connected together in strings, such as with junction boxes, micro-inverters, DC optimizers, power bus bars, or other local/module-level electronics.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

What is claimed is:

1. A photovoltaic module, comprising:
a plurality of solar cells;
a notched up-roof edge comprising a plurality of tabs;
a standoff comprising a plurality of peaks and valleys and having a first side fastened to a roof-facing side of the plurality of tabs of the notched up-roof edge and a second side, opposite the first side, configured to contact an underlying roof structure to position the notched up-roof edge a fixed distance above the underlying roof structure;
an attachment member secured to a roof-facing surface of the photovoltaic module proximate a down-roof edge of the photovoltaic module and configured to attach the photovoltaic module to a down-roof standoff of another photovoltaic module down-roof from the photovoltaic module.

2. The photovoltaic module of claim 1, wherein the attachment member is a clip that protrudes beneath a first side of the down-roof standoff that is coupled to a tab of a plurality of tabs of a notched up-roof edge of the other photovoltaic module.

3. The photovoltaic module of claim 1, wherein the standoff is separately fastened to each of the plurality tabs.

4. The photovoltaic module of claim 1, wherein a visual appearance of at least two roof tiles is provided by a notch located between a first tile-shaped portion and a second tile-shaped portion of the photovoltaic module.

5. The photovoltaic module of claim 1, further comprising a light transmissive sheet overlaying the plurality of solar cells.

6. The photovoltaic module of claim 1, wherein the plurality of peaks comprises flat upwardly facing portions fastened to the plurality of tabs; and wherein the plurality of valleys comprises flat portions interspersed with the upwardly facing portions that are configured to attach to the underlying roof structure.

7. The photovoltaic module of claim 6, wherein the flat upwardly facing portions are vertically offset from the flat portions of the plurality of valleys.

8. The photovoltaic module of claim 7, wherein the flat portions are positioned directly below notches located between adjacent tabs of the plurality of tabs.

9. The photovoltaic module of claim 1, wherein the standoff has a corrugated geometry.

10. A building integrated photovoltaic system, comprising:
   an underlying roof structure;
   a first photovoltaic module comprising a first corrugated standoff; and
   a second photovoltaic module positioned atop the underlying roof structure and up-roof from the first photovoltaic module, the second photovoltaic module comprising:
      a plurality of solar cells;
      an up-roof side;
      a down-roof side;
      a second corrugated standoff comprising:
         a first plurality of flat portions fastened to a roof-facing surface of the up-roof side and
         a second plurality of flat portions vertically offset from the first plurality of flat portions and configured to contact an underlying roof structure to position the up-roof side a fixed distance above the underlying roof structure;
      an attachment member secured to a roof-facing surface of the down-roof side that protrudes beneath a flat portion of the first corrugated standoff.

11. The building integrated photovoltaic system of claim 10, further comprising a notched edge on the up-roof side of the second photovoltaic module, the notched edge comprising a plurality of tabs.

12. The building integrated photovoltaic system of claim 11, wherein each tab of the plurality of tabs is fastened to a respective flat upwardly facing portion of a flat portion of the first plurality of flat portions of the second corrugated standoff.

13. The building integrated photovoltaic system of claim 10, wherein the plurality of solar cells of the second photovoltaic module are overlaid by a light transmissive top sheet.

14. The building integrated photovoltaic system of claim 13, wherein the plurality of solar cells are supported by a metal backer that is sealed to the light transmissive top sheet.

15. The building integrated photovoltaic system of claim 10, wherein the plurality of solar cells are electrically coupled together in series.

16. The building integrated photovoltaic system of claim 10, wherein the first and second corrugated standoffs define a plurality of openings and wherein the first and second corrugated standoffs are coupled to the photovoltaic modules and the underlying roof structures by fasteners extending through respective ones of the plurality of openings.

17. The building integrated photovoltaic system of claim 10, wherein the first and second corrugated standoffs are formed from sheet metal.

18. The building integrated photovoltaic system of claim 10, wherein the attachment member is a clip and engages the flat upwardly facing portion of the first corrugated standoff to prevent uplift of the second photovoltaic module.

* * * * *